United States Patent
Yoshida et al.

(10) Patent No.: US 9,930,779 B2
(45) Date of Patent: Mar. 27, 2018

(54) THROUGH WIRING SUBSTRATE

(71) Applicant: TDK CORPORATION, Tokyo (JP)

(72) Inventors: Kenichi Yoshida, Tokyo (JP); Tatsuya Harada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/581,606

(22) Filed: Apr. 28, 2017

(65) Prior Publication Data

US 2017/0318675 A1    Nov. 2, 2017

(30) Foreign Application Priority Data

Apr. 28, 2016  (JP) ................... 2016-090815

(51) Int. Cl.
| | |
|---|---|
| *H05K 1/09* | (2006.01) |
| *H05K 1/11* | (2006.01) |
| *H05K 3/42* | (2006.01) |
| *H05K 3/16* | (2006.01) |

(52) U.S. Cl.
CPC ............. *H05K 1/115* (2013.01); *H05K 1/09* (2013.01); *H05K 3/16* (2013.01); *H05K 3/422* (2013.01); *H05K 2201/09563* (2013.01)

(58) Field of Classification Search
CPC . H05K 1/115; H05K 1/09; H05K 3/16; H05K 3/422; H05K 2201/09563
USPC ....... 174/257, 250, 251, 255, 256, 258, 261, 174/262
See application file for complete search history.

(56) References Cited

U.S. PATENT DOCUMENTS

| | | |
|---|---|---|
| 6,379,159 B1 | 4/2002 | Mune et al. |
| 2003/0102223 A1 | 6/2003 | Shimo et al. |
| 2003/0173671 A1 | 9/2003 | Hironaga et al. |
| 2004/0011654 A1 | 1/2004 | Nakamura |
| 2004/0077154 A1 | 4/2004 | Nagarajan et al. |
| 2006/0022325 A1 | 2/2006 | Hwang et al. |
| 2006/0096781 A1 | 5/2006 | Yamano |
| 2006/0201201 A1 | 9/2006 | Fushie et al. |
| 2006/0216921 A1 | 9/2006 | Kato |
| 2007/0246253 A1 | 10/2007 | Yakabe et al. |
| 2008/0083558 A1 | 4/2008 | Chujo et al. |
| 2008/0092378 A1 | 4/2008 | Chujo et al. |
| 2008/0224271 A1 | 9/2008 | Sogawa et al. |
| 2008/0261396 A1 | 10/2008 | Yamano |

(Continued)

FOREIGN PATENT DOCUMENTS

| | | |
|---|---|---|
| JP | 2000-349198 A | 12/2000 |
| JP | 2005-019577 A | 1/2005 |

(Continued)

*Primary Examiner* — Tremesha S Willis
(74) *Attorney, Agent, or Firm* — Oliff PLC

(57) ABSTRACT

A through wiring substrate comprises a substrate having a pair of principal surfaces and a through hole penetrating between the pair of principal surfaces, the pair of principal surfaces and an inner surface of the through hole being electrically insulative; a through electrode provided on the inner surface of the through hole; a first wiring layer provided on one of the principal surfaces and connected to the through electrode; a second wiring layer provided on the other of the principal surfaces and connected to the through electrode; an underlying metal layer provided between the one of the principal surfaces and the first wiring layer; and catalyst metal particles existing between the underlying metal layer and the first wiring layer and between the through electrode and the inner surface of the through hole.

7 Claims, 4 Drawing Sheets

(56) References Cited

U.S. PATENT DOCUMENTS

| | | |
|---|---|---|
| 2009/0011201 A1 | 1/2009 | Ikeda et al. |
| 2009/0084588 A1 | 4/2009 | Sekine et al. |
| 2010/0116782 A1 | 5/2010 | Chujo et al. |
| 2011/0023298 A1 | 2/2011 | Chujo et al. |
| 2011/0062594 A1 | 3/2011 | Maekawa et al. |
| 2012/0329276 A1 | 12/2012 | Maekawa et al. |
| 2014/0021633 A1 | 1/2014 | Lee et al. |
| 2015/0076107 A1 | 3/2015 | Chujo et al. |

FOREIGN PATENT DOCUMENTS

| | | |
|---|---|---|
| JP | 2005-310934 A | 11/2005 |
| JP | 2006-024653 A | 1/2006 |
| JP | 2006-054307 A | 2/2006 |
| JP | 2006-135174 A | 5/2006 |
| JP | 2006-147970 A | 6/2006 |
| JP | 2006-147971 A | 6/2006 |
| JP | 2007-095743 A | 4/2007 |
| JP | 2010-098140 A | 4/2010 |
| JP | 2010-118645 A | 5/2010 |
| JP | 2011-003925 A | 1/2011 |
| JP | 2011-119750 A | 6/2011 |
| JP | 2013-110424 A | 6/2013 |
| WO | 2010/044315 A1 | 4/2010 |

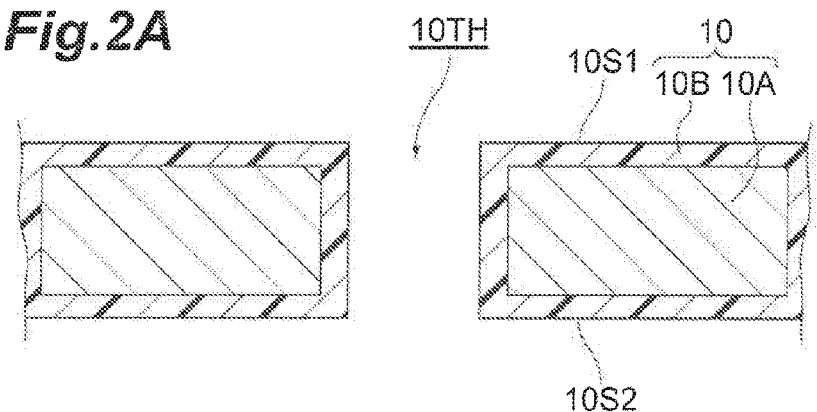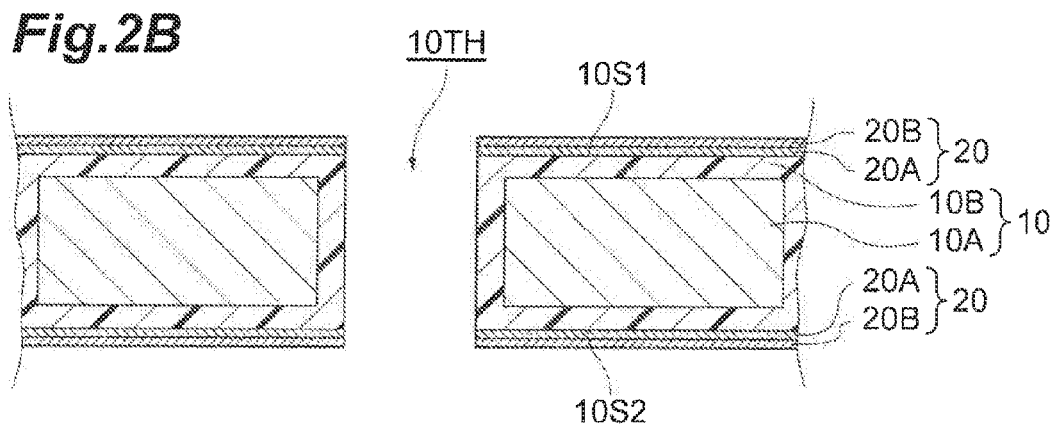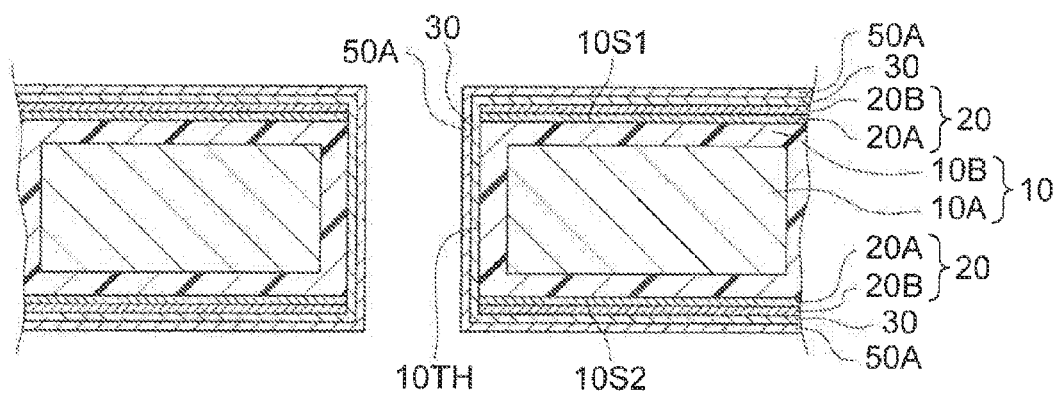

THROUGH WIRING SUBSTRATE

TECHNICAL FIELD

The present invention relates to a through wiring substrate.

BACKGROUND

There has been conventionally known a through wiring substrate having a pair of wiring structures provided on the front and rear surfaces and a through electrode connecting between the wiring structures.

CITATION LIST

Patent Literature

Patent Literature: Japanese Unexamined Patent Publication No. 2011-3925

SUMMARY

However, with such a conventional through wiring substrate, there can be a case where a short circuit arises in a gap between wiring structures when performing non-electrolytic plating of Ni/Au or the like on the surfaces of the wiring structures after patterning the wiring structures.

The present invention is devised in view of the aforementioned problem, and an object thereof is to provide a through wiring substrate in which a short circuit hardly arises in a gap between wiring structures even when performing non electrolytic plating on the surfaces of the wiring structures.

The through wiring substrate according to the present invention comprises: a substrate having a pair of principal surfaces and a through hole penetrating between the pair of principal surfaces, the pair, of principal surfaces and an inner surface of the through hole being electrically insulative; a through electrode provided on the inner surface of the through hole; a first wiring layer provided on one of the principal surfaces and connected to the through electrode; a second wiring layer provided on the other of the principal surfaces and connected to the through electrode; an underlying metal layer provided between the one of the principal surfaces and the first wiring layer; and catalyst metal particles existing between the underlying metal layer and the first wiring layer and between the through electrode and the inner surface of the through hole.

According to the present invention, due to the presence of the catalyst metal particles, the through electrode can be preferably provided on the inner surface of the through hole. Furthermore, when patterning a wiring structure including the first wiring layer and the underlying metal layer provided on the one of the principal surfaces of the substrate to expose the one of the principal surfaces of the substrate, since the underlying metal layer exists between the catalyst metal particles and the one of the principal surfaces of the substrate, the catalyst metal particles are sufficiently removed along with the underlying metal layer when removing the underlying metal layer by wet etching in patterning, and the catalyst metal particles hardly remain in the exposed part on the one of the principal surfaces of the substrate. Accordingly, when performing nonelectrolytic plating on the surface of the wiring structure with Ni/Au or the like after that, nonelectrolytic plating is hardly deposited in the exposed part on the surface of the substrate in a gap between wiring structures.

Herein, the underlying metal layer can have a first underlying metal layer containing at least one selected from the group consisting of Cr, Ni, W, Ta and Ti.

Due to the presence of the first underlying metal layer, adhesion between the one of the principal surfaces of the substrate and the first wiring layer is improved.

Moreover, the underlying metal layer can further have a second underlying metal layer containing at least one selected from the group consisting of Cu and Al on the first underlying metal layer.

Due to the presence of the second underlying metal layer, there is achieved an effect by which the catalyst metal particles can be more sufficiently removed on the principal surface.

Herein, the catalyst metal particles can be particles containing a noble metal.

Moreover, the through wiring substrate can further comprise a nonelectrolytic plating layer covering the first wiring layer.

Moreover, it can comprise a plurality of wiring structures each. Including the first wiring layer, the underlying metal layer and the catalyst metal particles on the one of the principal surfaces, a gap provided between the wiring structures.

Moreover, it can further comprise the underlying metal layer between the other of the principal surfaces and the second wiring layer, wherein the catalyst metal particles can further exist between the underlying metal layer and the second wiring layer.

According to the present invention, there can be realized a through wiring substrate in which nonelectrolytic plating is hardly deposited in a gap between wiring structures when performing nonelectrolytic plating on the surfaces of the wiring structures with Ni/Au or the like.

BRIEF DESCRIPTION OF THE DRAWINGS

FIG. 2A to FIG. 2C are cross-sectional views showing manufacturing processes of the through wiring substrate 100 according to an embodiment of the present invention;

DETAILED DESCRIPTION

Figure 1:
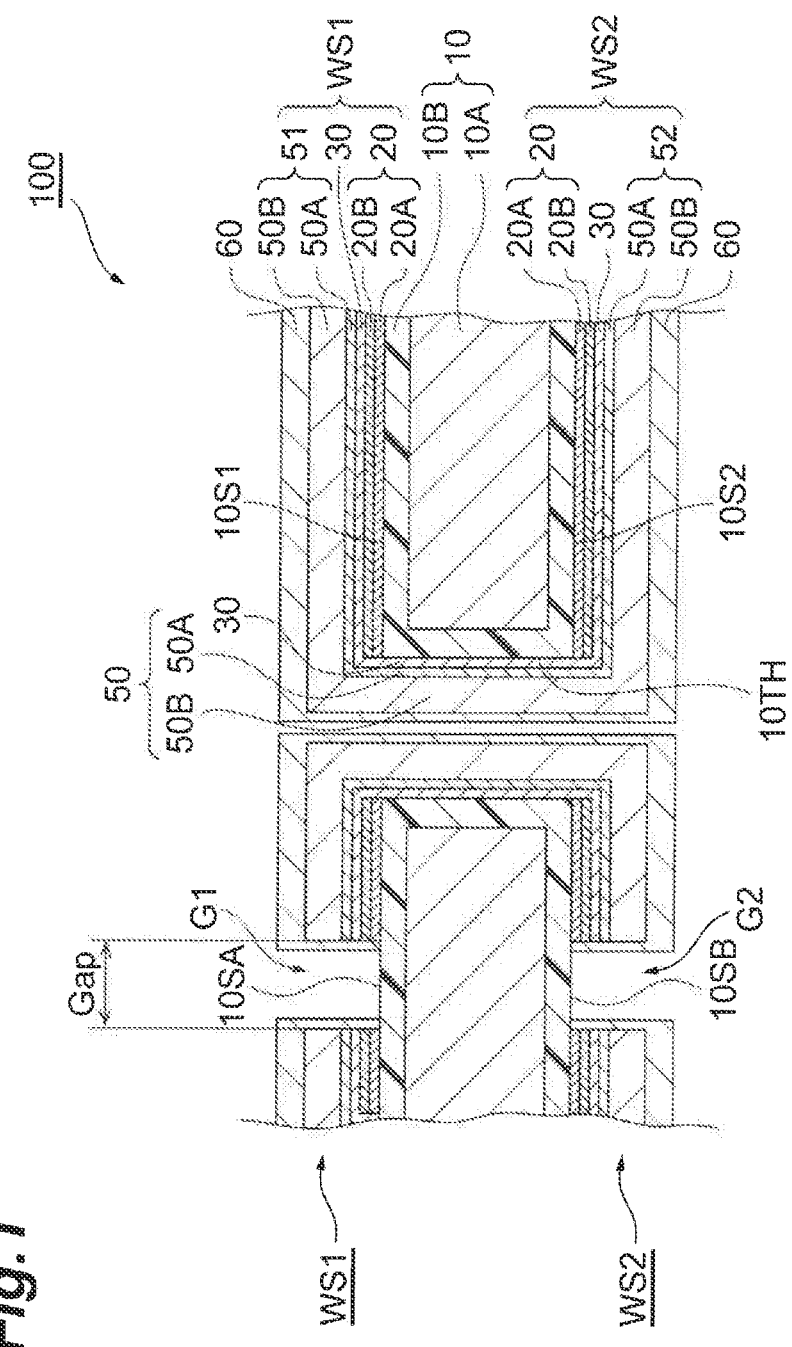
FIG. 1 is a cross-sectional view of a through wiring substrate 100 according to an embodiment of the present invention.

A through wiring substrate 100 according to an embodiment of the present invention is described with reference to FIG. 1.

The through wiring substrate 100 mainly has a substrate 10, a through electrode 50, a first wiring layer 51, a second wiring layer 52, underlying metal layers 20 and catalyst metal particles 30.

The substrate 10 has a pair of opposing principal surfaces 10S1 and 10S2, and further has a through hole 10TH penetrating between the principal surfaces 10S1 and 10S2.

The substrate 10 has a core material 10A and an insulative layer 10B covering the surface of the core material 10A, and the surfaces of the principal surfaces 10S1 and 10S2 and the through hole 10TH are formed of an insulative layer 10B.

An example of the core material 10A is, for example, a silicon wafer. An example of the insulative layer 10B is an insulative material such as silicon oxide, resin or alumina.

The thickness of the substrate 10 can be set, for example, to be 50 to 500 μm. Moreover, the diameter of the through hole 10TH can be set, for example, to be 5 to 200 μm. Moreover, the thickness of the insulative layer 10B can be set, for example, to be 0.1 to 50 μm.

The surface roughnesses (arithmetic average roughnesses Ra) of the principal surfaces 10S1 and 10S2 and the through hole 10TH can be 0.1 to 3 μm.

The underlying metal layers 20 are respectively provided on the first principal surface 10S1 and the second principal surface 10S2. The underlying metal layer 20 sequentially includes a first underlying metal layer 20A and a second underlying metal layer 20B in the order from the substrate 10 side.

The first underlying metal layer 20A is a metal or alloy layer containing one or more elements selected from the group consisting of Cr, Ni, W, Ta and Ti. The thickness of the first underlying metal layer 20A can be set to be 5 to 100 nm. To the first underlying metal layer 20A, a function for improving adhesion between the first wiring layer 51 and second wiring layer 52 and the substrate 10 can be given. The first underlying metal layer 20A can be formed by a sputtering method.

The second underlying metal layer 20B is a metal or alloy layer containing one or more elements selected from the group consisting of Cu and Al. The thickness of the second underlying metal layer 20B can be set to be larger than that of the first underlying metal layer 20A, and can be set to be 100 to 3000 nm. The second underlying metal layer 20B can be formed by a sputtering method. To the second underlying metal layer 20B, a function with which catalyst metal particles can be more sufficiently removed on the principal surfaces can be given.

The catalyst metal particles 30 exist between the underlying metal layer 20 and the first wiring layer 51, between the underlying metal layer 20 and the second wiring layer 52, and between the through electrode 50 and the inner surface of the through hole 10TH. The thickness of a layer formed of the catalyst metal particles 30 is exceedingly small, and the thickness is approximately 1 to 10 nm in the case of forming a layer, or a state where catalyst metal particles are dispersed and disposed on the surface without forming a layer is also possible. An example of the catalyst metal is a noble metal such as Pd, Ag, Pt, Au, Th, Ir, Ru or Os.

The particle diameter of the catalyst particles can be, for example, 0.1 to 5 nm.

In the first principal surface 10S1, the first wiring layer 51 is provided on the catalyst metal particles 30. In the second principal surface 10S2, the second wiring layer 52 is provided on the catalyst metal particles 30. In the inner surface of the through hole 10TH, the through electrode 50 is provided on the catalyst metal particles 30.

Each of the first wiring layer 51, the second wiring layer 52 and the through electrode 50 has a lower wiring layer 50A and an upper wiring layer 50B.

The thickness of the lower wiring layer 50A can be set to be 0.1 to 3 The lower wiring layer 50A is a metal or alloy layer containing one or more elements selected from the group consisting of Cu and Ni. The lower wiring layer 50A can be formed by nonelectrolytic plating.

The upper wiring layer 5OB is a metal or alloy layer containing one or more elements selected from the group consisting of Cu and Ni, and can have the same composition as that of the lower wiring layer 50A. With the lower wiring layer 50A being as a seed electrode, the upper wiring layer 50B can be formed by electroplating. The thickness of the upper wiring layer 50B can be 1 to 20 μm.

On the first principal surface 10S1, the underlying metal layer 20, the catalyst metal particles 30 and the first wiring layer 51 constitute a wiring structure WS1, and on the second principal surface 10S2, the underlying metal layer 20, the catalyst metal particles 30 and the second wiring layer 52 constitute a wiring structure WS2. Further, a combination of the wiring structure WS1, the wiring structure WS2 and the through electrode 50 constitutes one circuit. Omitted in the figure, the through wiring substrate 100 has many combinations of the wiring structures WS1, the wiring structures WS2 and the through electrodes 50.

On the first principal surface 10S1, a first gap G1 in which the underlying metal layer 20, the catalyst metal particles 30 and the first wiring layer 51 are not formed is provided between the wiring structures WS1. On the second principal surface 10S2, a second gap G2 in which the underlying metal layer 20, the catalyst metal particles 30 and the second wiring layer 52 are not formed is provided between the wiring structures WS2. In the first gap G1 and the second gap G2, the first principal surface 10S1 and the second principal surface 10S2 are exposed, respectively.

The widths of the gaps G1 and G2 can be set, for example, to be 5 to 500 μm.

A nonelectrolytic plating layer 60 is provided on the surfaces of the wiring structure WS1, the wiring structure WS2 and the through electrode 50, that is, on the surface of the upper wiring layer 50B; and on the end face of the upper wiring layer 50B, the end faces of the lower wiring layer 50A, the catalyst metal particles 30 and the underlying metal layer 20 (inner surfaces of the first gap G1 and the second gap G2).

The nonelectrolytic plating layer 60 is, for example, Ni/Au and Ni/Pd/Au in the order from the wiring layer side. The thickness of the Ni layer can be set to be 500 to 5000 nm, the thickness of the Au layer to be 10 to 1000 nm, and the thickness of the Pd layer to be 50 to 1000 nm.

Subsequently, an example of a manufacturing method of the through wiring substrate 100 is described with reference to FIGS. 2A to 2C, FIG. 3A and FIG. 3B.

First, as shown in FIG. 2A, the substrate 10 having the core material 10A having the through hole 10TH and the insulative layer 10B covering the surface of the core material 10A is prepared. Such a substrate 10 can be obtained by a known method. For example, it is a method of forming an insulative layer on the surface of a silicon core material having a through hole by a method such as application, spraying or CVD, a method of burying a silicon core material having a through hole in a resin, and after that, boring a through hole in the resin with laser or the like, or the similar method.

Subsequently, as shown in FIG. 2B, the first underlying metal layers 20A and the second underlying metal layers 20B are formed on the first principal surface 10S1 and the second principal surface 10S2 of the substrate 10 by a sputtering method. Since in the sputtering method, atoms hardly sneak into the through hole 10TH, the first underlying metal layer 20A and the second underlying metal layer 20B are almost not formed in the through hole 10TH.

Subsequently, as shown in FIG. 2C, the catalyst metal particles 30 are formed on the surfaces of the second underlying metal layer 20B and the through hole 10TH. For example, processing such as bringing colloid in which fine particles of catalyst metal particles are dispersed into contact with these surfaces to dry them after that, a method of bringing a catalyst metal ion solution into contact with these surfaces to reduce the ions after that, or fixing particles of a Pd—Sn compound onto these surfaces to elute Sn after that can also be performed.

Subsequently, the lower wiring layer 50A is formed on the catalyst metal particles 30. The lower wiring layer 50A can be formed by nonelectrolytic plating with the catalyst metal particles 30 being as a catalyst.

Figure 3A:
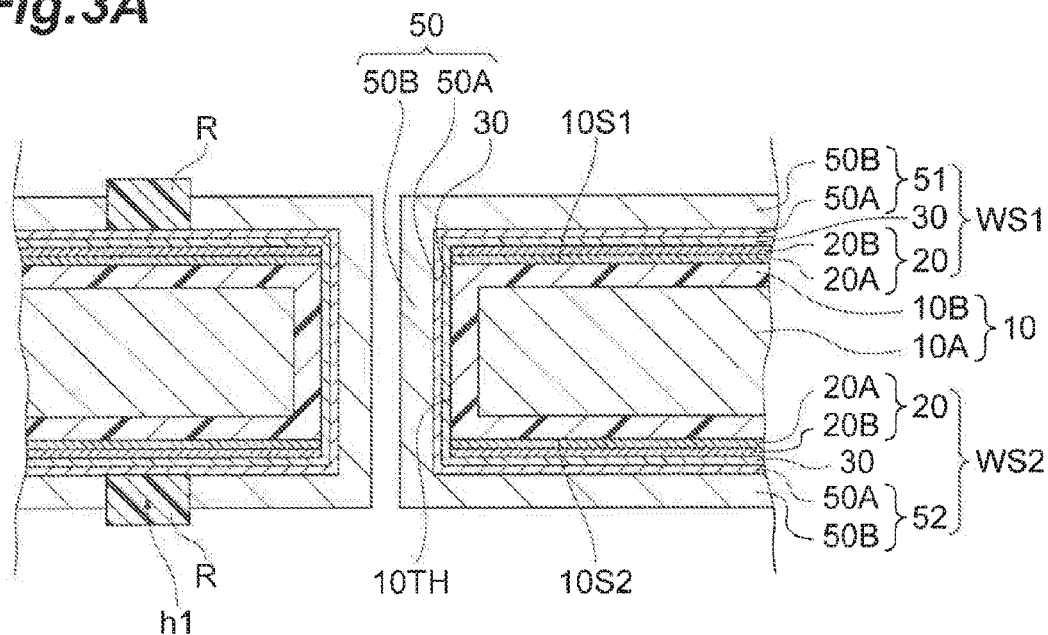
FIG. 3A and FIG. 3B are cross-sectional views succeeding to FIG. 2C and showing manufacturing processes of the through wiring substrate 100 according to an embodiment of the present invention.

Subsequently, as shown in FIG. 3A, a part on the lower wiring layer 50A is covered with a resist R, and after that, the upper wiring layer 50B is formed in the rest part on the lower wiring layer 50A by electroplating with the lower wiring layer 50A being as seeds.

Figure 3B:
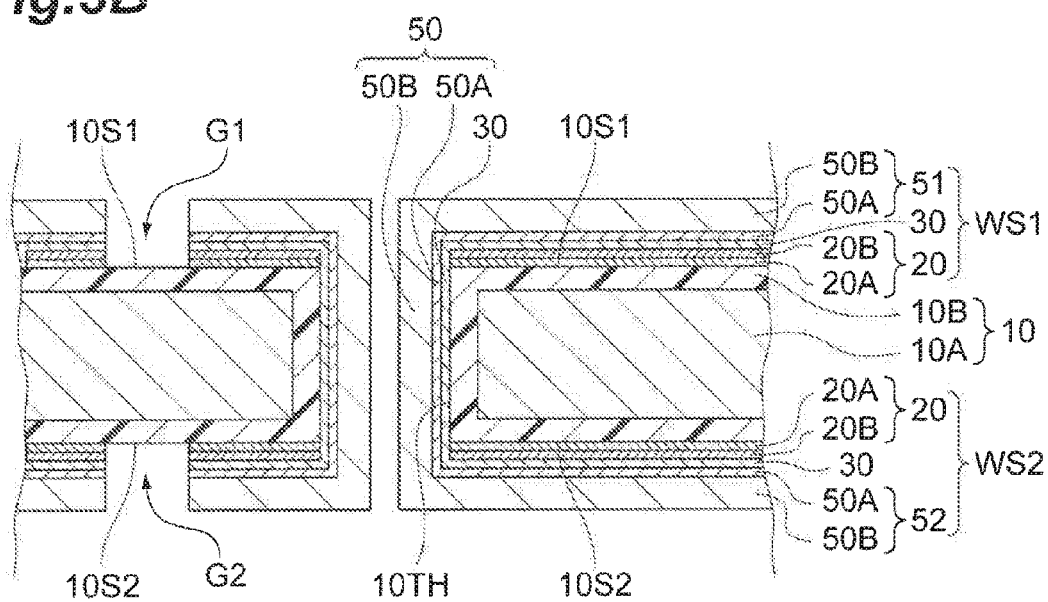

Subsequently, the resist R is peeled off from the lower wiring layer 50A to form opening parts of the upper wiring layer 50B. Furthermore, as shown in FIG. 3B, the lower wiring layer 50A, the catalyst metal particles 30 and the underlying metal layers 20 that constitute the bottom faces of the opening parts are removed. A wet etching method is applied to the removal of these layers. Thereby, the first principal surface 10S1 and the second principal surface 10S2 are exposed to form the first gap G1 and the second gap G2. Examples of the wet etching solution include solutions (aqueous solutions and the like) containing: acids such as sulfuric acid, nitric acid and hydrochloric acid; reductive salts such as a persulfate salt; hydrogen peroxide; multivalent metal ions such as trivalent iron ions, divalent copper ions and heptavalent manganese ions; and the like.

Finally, the nonelectrolytic plating layer 60 is formed on the surface exposed parts of the wiring structure WS1, the wiring structure WS2 and the through electrode 50 by nonelectrolytic plating, and thereby, the through wiring substrate in FIG. 1 is obtained. A forming method of the nonelectrolytic plating layer is known.

According to the present embodiment, due to the presence of the catalyst metal particles 30. The through electrode 50 high in adhesion can be provided on the inner surface of the through hole 10TH. Furthermore, when patterning the wiring structures WS1 and WS2 provided on the principal surfaces 10S1 and 10S2 of the substrate 10 to form the first gap G1 and the second gap G2 and to expose the principal surfaces 10S1 and 10S2 of the substrate 10, the underlying metal layers 20 exist between the catalyst metal particles 30 and the principal surfaces 10S1 and 10S2 of the substrate 10. Accordingly, the catalyst metal particles 30 are removed along with the underlying metal layers 20 in patterning the underlying metal layers 20 by wet etching, and the catalyst metal particles 30 hardly remain on the exposed parts of the principal surfaces 10S1 and 10S2 of the substrate. Accordingly, when forming the nonelectrolytic plating layer on the surfaces of the wiring structures WS1 and WS2 after that, the nonelectrolytic plating layer is hardly deposited on the exposed parts of the principal surfaces 10S1 and 10S2 of the substrate. Accordingly, short circuits between the first gaps G1 and between the second gaps G2 due to the nonelectrolytic plating layer 60 are suppressed.

Further, in such a through wiring substrate 100, the widths of the gaps G1 and G2 can be made small, which enables high density and downsizing.

The present invention is not limited to the aforementioned embodiment but can attain various modifications.

For example, the substrate 10 only has to have electric insulation on its surface while having a through hole, and does not have to have a structure having the core material 10A and the insulative layer 10B as in the aforementioned embodiment. For example, it may be a substrate obtained by impregnating glass cloth with resin, a ceramic substrate of alumina or the like, or the similar substrate.

Moreover, while in the aforementioned embodiment, the underlying metal layers 20 and the catalyst metal particles 30 formed thereon are included on both the first principal surface 10S1 and the second principal surface 10S2, when they are included on any one of those, at least the one surface has the aforementioned effect.

Moreover, while in the aforementioned embodiment, both the first underlying metal layer 20A and the second underlying metal layer 20B are included as the underlying metal layer 20, any one of them is sufficient, or another metal layer may be further included as the underlying metal layer 20.

Figure 4:
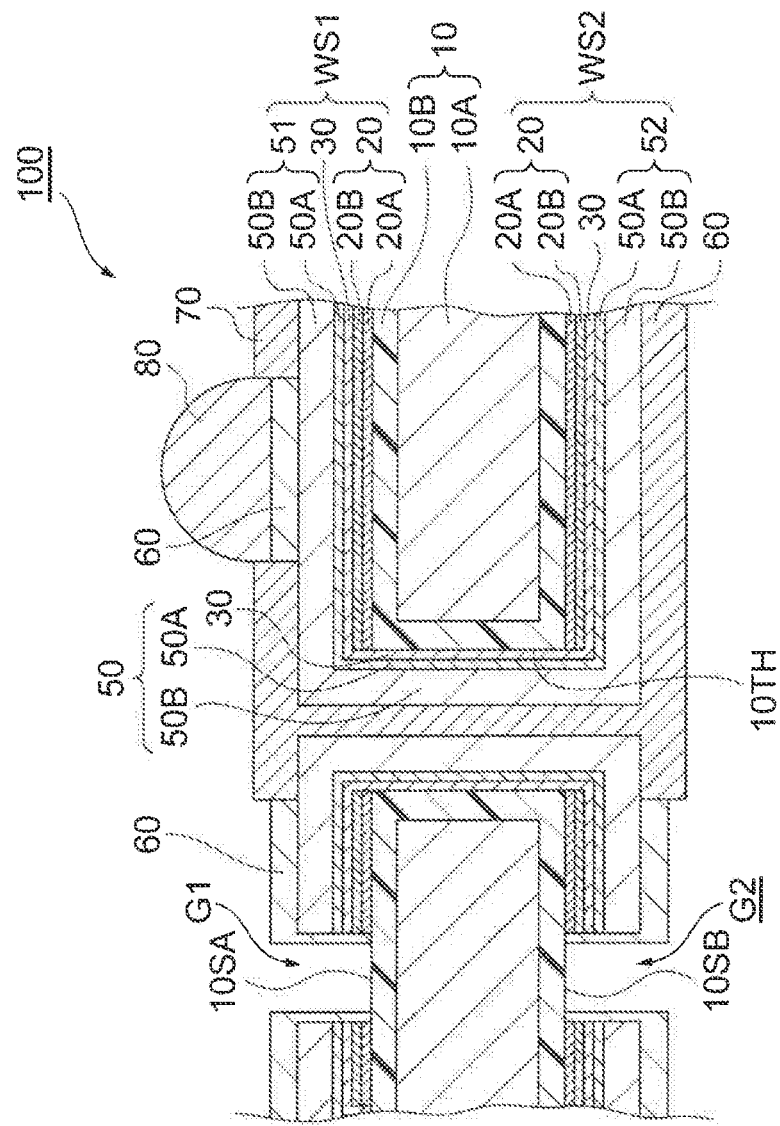
FIG. 4 is a cross-sectional view of the through wiring substrate 100 according to another embodiment of the present invention.

Moreover, as shown in FIG. 4, an electrically insulative layer 70 of resin or the like may be included on each upper wiring layer 50B of the first wiring layer 51, the second wiring layer 52 and the through electrode 50 without forming the nonelectrolytic plating layer 60 (in this case, the through hole 10TH can be completely filled therewith), a solder ball 80 may be provided on the nonelectrolytic plating layer 60, and an electrically insulative layer of resin or the like may be further included on the nonelectrolytic plating layer 60.

Moreover, the shape and the like of the wiring can be properly selected in accordance with the purpose and the like.

EXAMPLES

Example 1

A silicon-made core material having many through holes and the thickness of 200 μm was prepared, and an insulative layer of epoxy resin having the thickness of 25 μm was formed on its surface to obtain the substrate 10. The inner diameter of the through hole 10TH of the substrate 10 was 80 μm. The arithmetic average surface roughness Ra of the resin insulative layer of the substrate 10 was 0.3 μm.

On both principal surfaces 10S1 and 10S2 of the substrate, Cr layers were formed to have 10 nm as the first underlying metal layers 20A of the underlying metal layers 20 by a sputtering method, and after that, Cu layers were formed to have 0.2 μm as the second underlying metal layers 20B of the underlying metal layers 20 by a sputtering method.

Subsequently, after the substrate with the underlying metal layers was dipped in an alkaline palladium ion solution, by performing a reduction treatment, palladium particles were precipitated on the surface as the catalyst metal particles 30 on the underlying metal layers 20 and the inner surface of the through hole 10TH.

Next, by a nonelectrolytic plating method, a Cu layer having 0.4 μm was formed as the lower wiring layer 50A on the underlying metal layers 20 and the inner surface of the through hole 10TH with the palladium particles being as a catalyst.

Subsequently, on the lower wiring layer 50A, a resist pattern for forming meander-type wiring with 100 μm of wiring width was formed. Portions with the width of 10 μm, the width of 20 μm, the width of 40 μm and the width of 80 μm as the gap widths between wires were provided. The upper wiring layer 50B was formed to have 10 μm in the portions that were not covered with the resist by electroplating with the lower wiring layer 50A being as a seed layer. Moreover, on both the first principal surface and the second principal surface, meander-type wirings were formed to have a structure in which these were conducted with the through electrodes.

After that, the resist was peeled off, and the exposed parts of the lower wiring layer 50A, and the catalyst metal particles 30 and the underlying metal layers 20 which were under those were removed by wet etching to form gaps. As the etching solution, a solution containing trivalent iron ions was used.

Subsequently, as shown in FIG. 4, the resin electrically insulative layer 70 was formed on the upper wiring layers 50B of the through electrodes 50 and parts of the surfaces of the wiring structures WS1 and WS2. In the electrically insulative layer 70, opening parts for lands (opening diameter of 500 μm) were provided. Finally, the nonelectrolytic plating layer (Ni/Au) 60 was formed on the surfaces of the through electrodes 50 and the wiring structures WS1 and WS2, the surfaces not covered with the electrically insulative layer 70. The thickness of the Ni layer was set to be 3000 nm, and the thickness of the Au layer to be 50 nm.

Example 2

This was the same as the Example 1 except using Ti films of 10 nm as the first underlying metal layers 20A of the underlying metal layers 20, and using a solution containing trivalent iron ions and a solution containing hydrogen peroxide as the etching solution.

Example 3

This was the same as Example 1 except using silver colloid as the dip solution in forming the catalyst metal particles 30.

Example 4

This was the same as Example 3 except using Ti films of 10 nm as the first underlying metal layers 20A of the underlying metal layers 20, and using a solution containing trivalent iron ions and a solution containing hydrogen peroxide as the etching solution.

Example 5

This was the same as Example 1 except using Sn—Pd colloid as the dip solution in forming the catalyst metal particles 30 and eluting Sn after that, and using a $SiO_2$ layer with the thickness of 2 μm as the insulative layer of the substrate. The arithmetic average surface roughness Ra of the substrate was set to be 0.1 μm.

Example 6

This was the same as Example 5 except using Ti films of 10 nm as the first underlying metal layers 20A of the underlying metal layers 20, and using a solution containing trivalent iron ions and a solution containing hydrogen peroxide as the etching solution.

Example 7

This was the same as Example 1 except that the arithmetic average surface roughness Ra of the resin insulative layer of the substrate was set to be 1.0 μm, that Cr films of 10 nm were used as the first underlying metal layers 20A of the underlying metal layers 20, and that a solution containing trivalent iron ions and a solution containing hydrogen peroxide were used as the etching solution.

Comparative Example 1

This was the same as Example 1 except that the catalyst metal particles 30 were not given, and that the formation of the lower wiring layer 50A by nonelectrolytic plating using the catalyst metal particles 30 was not performed.

Comparative Example 2

This was the same as Example 1 except that the underlying metal layers 20 including the first underlying metal layers (Cr layers) 20A and the second underlying metal layers (Cu layers) 20B were not formed.

Comparative Example 3

This was the same as Example 7 except that the catalyst metal particles 30 were not given, and that the formation of the lower wiring layer 50A by nonelectrolytic plating using the catalyst metal particles 30 was not performed.

Comparative Example 4

This was the same as Example 7 except that the underlying metal layers 20 including the first underlying metal layers (Cr layers) 20A and the second underlying metal layers (Cu layers) 20B were not formed.

(Evaluation 1: Gaps)

After formation of the nonelectrolytic plating layer 60, it was observed whether short circuits due to the nonelectrolytic plating layer 60 arose in the gaps.

(Evaluation 2: Shear Tests)

Solder balls 80 with the diameter of 500 μm were joined onto the nonelectrolytic plating layer 60 of the wiring structure WS1 in the opening parts of the electrically insulative layer 70 by a thermal treatment at 260° C. for 0.5 minutes. Next, using a high speed bondtester (product name: DACE-4000HS, Nordson DACE), a shear test was performed by giving force in the direction parallel to the principal surface of the substrate to the solder balls 80 to give the shearing force to the substrate 10 and the solder balls 80. Then, SEM observation of a fracture portion after the shear test was performed to observe a shear failure mode. As the result of the observation, a failure inside the solder was evaluated as a "solder failure", and a failure between the wire and the insulative layer of the substrate was evaluated as a "failure between the substrate and the wiring layer".

(Evaluation 3: Through Electrodes)

It was determined based on sectional SEM observation whether or not the through electrode was formed along the inner surface of the through hole. "OK" indicates that the through electrode was formed along the inner surface of the through hole, and "NG" indicates that the through electrode was not formed along the inner surface of the through hole.

(Evaluation 4: High Frequency Transmission Performance)

With an AC resistance between a meander wire on one surface and a meander wire on the other surface at 1 GHz being set to be Rac and a DC resistance between these wires being set to be Rdc, Rac/Rdc was obtained.

Table 1 to Table 3 present the conditions and the results.

TABLE 1

| | Substrate | | |
|---|---|---|---|
| | Core Material | Surface Insulative Layer (Thickness, Ra) | Through Hole Diameter |
| Example 1 | Si (Thickness 200 μm) | Epoxy Resin (25 μm, 0.3 μm) | 80 μm |
| Example 2 | Si (Thickness 200 μm) | Epoxy Resin (25 μm, 0.3 μm) | 80 μm |
| Example 3 | Si (Thickness 200 μm) | Epoxy Resin (25 μm, 0.3 μm) | 80 μm |
| Example 4 | Si (Thickness 200 μm) | Epoxy Resin (25 μm, 0.3 μm) | 80 μm |
| Example 5 | Si (Thickness 200 μm) | SiO$_2$ (2 μm, 0.1 μm) | 80 μm |
| Example 6 | Si (Thickness 200 μm) | SiO$_2$ (2 μm, 0.1 μm) | 80 μm |
| Example 7 | Si (Thickness 200 μm) | Epoxy Resin (25 μm, 1.0 μm) | 80 μm |
| Comparative Example 1 | Si (Thickness 200 μm) | Epoxy Resin (25 μm, 0.3 μm) | 80 μm |
| Comparative Example 2 | Si (Thickness 200 μm) | Epoxy Resin (25 μm, 0.3 μm) | 80 μm |
| Comparative Example 3 | Si (Thickness 200 μm) | Epoxy Resin (25 μm, 1.0 μm) | 80 μm |
| Comparative Example 4 | Si (Thickness 200 μm) | Epoxy Resin (25 μm, 1.0 μm) | 80 μm |

In Comparative Examples 2 and 4 where the underlying metal layers 20 were not provided, short circuits due to electroplating arose in the case of shorter gaps. Moreover, in Comparative Example 2 where the underlying metal layers 20 were not provided, adhesion between the wiring layer and the substrate also deteriorated. In Comparative Examples 1 and 3 where the catalyst metal particles 30 and the lower wiring layer 50A were not included, the through electrode 50 was not formed along the inner surface of the through hole 10TH. In Example 7 and Comparative Examples 3 and 4 where the surface roughnesses of the substrates were large, high frequency transmission characteristics deteriorated.

What is claimed is:

1. A through wiring substrate comprising:
    a substrate having a pair of principal surfaces and a through hole penetrating between the pair of principal surfaces, the pair of principal surfaces and an inner surface of the through hole being electrically insulative;
    a through electrode provided on the inner surface of the through hole;
    a first wiring layer provided on one of the principal surfaces and connected to the through electrode;
    a second wiring layer provided on the other of the principal surfaces and connected to the through electrode;
    an underlying metal layer provided between the one of the principal surfaces and the first wiring layer, the underlying metal layer having a first underlying metal layer containing at least one selected from the group con-

TABLE 2

| | Underlying Metal Layer (Sputtering) | | | First Wiring Layer 51, Second Wiring Layer 52, Through Electrode 50 | |
|---|---|---|---|---|---|
| | First Metal Layer 20A | Second Metal Layer 20B | Catalyst Metal Particles | Lower Wiring Layer 50A | Upper Wiring Layer 50B |
| Example 1 | Cr/10 nm | Cu/0.2 μm | Pd Colloid (Alkaline) | Nonelectrolytic Plating 0.4 μm | Electroplating 10 μm |
| Example 2 | Ti/10 nm | Cu/0.2 μm | Pd Colloid (Alkaline) | Nonelectrolytic Plating 0.4 μm | Electroplating 10 μm |
| Example 3 | Cr/10 nm | Cu/0.2 μm | Ag Colloid | Nonelectrolytic Plating 0.4 μm | Electroplating 10 μm |
| Example 4 | Ti/10 nm | Cu/0.2 μm | Ag Colloid | Nonelectrolytic Plating 0.4 μm | Electroplating 10 μm |
| Example 5 | Cr/10 nm | Cu/0.2 μm | SnPd Colloid | Nonelectrolytic Plating 0.4 μm | Electroplating 10 μm |
| Example 6 | Ti/10 nm | Cu/0.2 μm | SnPd Colloid | Nonelectrolytic Plating 0.4 μm | Electroplating 10 μm |
| Example 7 | Cr/10 nm | Cu/0.2 μm | Pd Colloid (Alkaline) | Nonelectrolytic Plating 0.4 μm | Electroplating 10 μm |
| Comparative Example 1 | Cr/10 nm | Cu/0.2 μm | — | — | Electroplating 10 μm |
| Comparative Example 2 | — | — | Pd Colloid (Alkaline) | Nonelectrolytic Plating 0.4 μm | Electroplating 10 μm |
| Comparative Example 3 | Cr/10 nm | Cu/0.2 μm | — | — | Electroplating 10 μm |
| Comparative Example 4 | — | — | Pd Colloid (Alkaline) | Nonelectrolytic Plating 0.4 μm | Electroplating 10 μm |

TABLE 3

| | Short Circuit in Wiring Gap during Nonelectrolytic Plating Gap Distance | | | | Implementation Adhesion Solder Shearing | Connection in Via Sectional | High Frequency Transmission |
|---|---|---|---|---|---|---|---|
| | 10 μm | 20 μm | 40 μm | 80 μm | Failure Mode | Observation | Rac/Rdc |
| Example 1 | None | None | None | None | Solder Failure | OK | <5 |
| Example 2 | None | None | None | None | Solder Failure | OK | <5 |
| Example 3 | None | None | None | None | Solder Failure | OK | <5 |
| Example 4 | None | None | None | None | Solder Failure | OK | <5 |
| Example 5 | None | None | None | None | Solder Failure | OK | <5 |
| Example 6 | None | None | None | None | Solder Failure | OK | <5 |
| Example 7 | None | None | None | None | Solder Failure | OK | 5-10 |
| Comparative Example 1 | None | None | None | None | Solder Failure | NG | <5 |
| Comparative Example 2 | Present | Present | None | None | Peeling-Off between the Substrate and the Wiring Layer | OK | <5 |
| Comparative Example 3 | None | None | None | None | Solder Failure | NG | 5-10 |
| Comparative Example 4 | Present | Present | Present | None | Solder Failure | OK | 5-10 | sisting of Cr, Ni, W, Ta and Ti and a second underlying metal layer containing at least one selected from the group consisting of Cu and Al on the first underlying metal layer; and catalyst metal particles existing between the underlying metal layer and the first wiring layer and between the through electrode and the inner surface of the through hole, the second underlying metal layer being between the first underlying metal layer and the catalyst metal particles.

2. The through wiring substrate according to claim 1, wherein the catalyst metal particles are particles containing a noble metal.

3. The through wiring substrate according to claim 1, further comprising a nonelectrolytic plating layer covering the first wiring layer.

4. The through wiring substrate according to claim 1, comprising a plurality of wiring structures each including the first wiring layer, the underlying metal layer and the catalyst metal particles on the one of the principal surfaces, a gap provided between the wiring structures.

5. The through wiring substrate according to claim 1, further comprising the underlying metal layer between the other of the principal surfaces and the second wiring layer, wherein the catalyst metal particles further exist between the underlying metal layer and the second wiring layer.

6. The through wiring substrate according to claim 1, wherein the first and the second underlying metal layers are of different metals.

7. The through wiring substrate according to claim 1, wherein the second underlying metal layer is thicker than the first underlying metal layer.

\* \* \* \* \*